United States Patent
Jang

(12) 
(10) Patent No.: US 6,255,207 B1
(45) Date of Patent: Jul. 3, 2001

(54) COMPOSITE PLANARIZING DIELECTRIC LAYER EMPLOYING HIGH DENSITY PLASMA CHEMICAL VAPOR DEPOSITED (HDP-CVD) UNDERLAYER

(75) Inventor: Syun-Ming Jang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/336,811

(22) Filed: Jun. 21, 1999

(51) Int. Cl.$^7$ ................................................... H01L 21/44
(52) U.S. Cl. .................... 438/597; 438/700; 438/437; 438/624
(58) Field of Search .......................... 438/637, 672, 438/626, 624, 597, 700, 439

(56) References Cited

U.S. PATENT DOCUMENTS

| | | | |
|---|---|---|---|
| 5,621,241 | 4/1997 | Jain | 257/632 |
| 5,679,606 | 10/1997 | Wang et al. | 437/195 |
| 5,723,358 | * 3/1998 | Manley . | |
| 5,759,906 | 6/1998 | Lou | 438/623 |
| 5,955,380 | * 9/1999 | Lee | 438/706 |

FOREIGN PATENT DOCUMENTS

410199877 * 7/1998 (JP) .

* cited by examiner

Primary Examiner—Caridad Everhart
(74) Attorney, Agent, or Firm—George O. Saile; Stephen B. Ackerman; Alek P. Szecsy

(57) ABSTRACT

A method for forming upon a substrate employed within a microelectronics fabrication a composite dielectric layer having etched via contact holes in which via poisoning is attenuated. There is provided a substrate employed within a microelectronics fabrication. There is formed upon the substrate a patterned microelectronics layer. There is then formed upon the substrate a blanket silicon containing dielectric layer employing high density plasma chemical vapor deposition (HDP-CVD). There is then formed upon the blanket silicon containing glass dielectric layer a low dielectric constant dielectric layer over which is formed a silicon oxide dielectric cap layer to form a composite inter-level metal dielectric (IMD) layer. There is then etched through the composite IMD dielectric layer a series of via contact holes. The method of formation, surface profile and properties of the blanket silicon containing glass dielectric layer provides attenuated via poisoning after via hole etching.

17 Claims, 2 Drawing Sheets

COMPOSITE PLANARIZING DIELECTRIC LAYER EMPLOYING HIGH DENSITY PLASMA CHEMICAL VAPOR DEPOSITED (HDP-CVD) UNDERLAYER

BACKGROUND OF THE INVENTION

1. Field of the Invention

This invention relates to the field of dielectric layers formed on substrates within microelectronics fabrications. More particularly, the invention relates to silicon containing glass dielectric layers employed with composite layers within microelectronics fabrications.

2. Description of the Related Art

Microelectronics fabrications comprise microelectronics active devices fabricated upon substrates interconnected by patterned microelectronics conductor layers separated by microelectronics dielectric layers. As device dimensions have diminished and device switching speeds have increased, circuit operation has become increasingly limited by capacitance delays due to close proximity of conductor lines. Efforts to minimize capacitance have been devoted to improving the quality of the dielectric materials forming the layers separating the conductor interconnection pattern.

While silicon containing materials such as, for example, silicon oxide and silicon nitride have been satisfactory as dielectric materials from forming inter-metal dielectric (IMD) layers these materials are not without disadvantages for this purpose. The dielectric constants of these materials, whose values range from 4 to 8, result in undesirably high capacitance leading to increased signal coupling and cross-talk between adjacent conductor lines. Dielectric materials with lower dielectric constants which are suitable for forming dielectric layers have been developed such as silsesquioxane spin-on-glass (SOG) dielectric materials, amorphous carbon dielectric materials and organic polymer spin-on-polymer (SOP) dielectric materials. Such materials are readily formed as dielectric layers, and have advantages when formed as composite dielectric layers upon silicon containing dielectric underlayers which have been previously formed upon a microelectronics fabrication substrate.

In particular, spin-on dielectric materials having dielectric constants ranging from 2 to 3 have found application as low dielectric constant dielectric materials for inter-level metal dielectric (IMD) layers. Organic polymer spin-on-polymer (SOP) dielectric materials and silsesquioxane spin-on-glass (SOG) dielectric materials deposited upon silicon oxide underlayers may be employed to form inter-level metal dielectric (IMD) layers within microelectronics fabrications. However, the formation of low dielectric constant composite dielectric layers employing spin-on-glass (SOG) dielectric materials such as hydrogen silsesquioxane (HSQ) formed upon silicon oxide underlayers is not without problems.

For example, the formation of via contact holes through inter-level metal dielectric (IMD) layers employing photolithographic masking and etching methods may result in absorption or trapping of materials of the via contact hole formation processes, particularly moisture. This may result in subsequent contamination of the microelectronics fabrication, and is commonly referred to as the "via poisoning" problem. The contaminated or "poisoned" via problem may be exacerbated if the silicon oxide underlayer is porous and retains material, particularly moisture, from the etching of the organic polymer low dielectric constant dielectric upper layer of the IMD layer. This is commonly observed when the silicon oxide underlayer is formed employing the method of sub-atmospheric pressure thermal chemical vapor deposition (SACVD) or near atmospheric pressure chemical vapor deposition (APCVD) in order to obtain a planar surface. Surface planarity is characteristically more readily achieved by these methods, but the silicon oxide layers are less dense than silicon oxide layers produced by, for example. plasma enhanced chemical vapor deposition (PECVD) or thermal oxidation of silicon.

It is therefore towards the goal of forming upon a substrate employed within a microelectronics fabrication an inter-level metal dielectric (IMD) layer with attenuated "poisoned via" contamination and inter-level capacitance that the present invention is generally directed.

Various methods have been disclosed for forming inter-level metal dielectric (IMD) layers upon substrates within microelectronics Fabrications.

For example. Jain, in U.S. Pat. Ser. No. 5,621,241, discloses a method for forming a dielectric stack layer with improved planarity and uniformity upon a semiconductor device with both high and low aspect ratio conductor lines on a common level. The method employs high density plasma chemical vapor deposition of silicon dioxide over conductors followed by a plasma enhanced chemical vapor deposition of a silicon dioxide layer which serves as a polish layer.

Further, Wang et al., in U.S. Pat. No. 5,679,606, disclose a method for forming a planar inter-metal dielectric (IMD) dielectric layer over closely spaced metal lines on a semiconductor surface. The method employs electron cyclotron resonance (ECR) method for forming a silicon oxide layer, followed by formation of a gap filling dielectric layer employing simultaneous deposition/sputtering to smooth out the surface of the IMD layer. The sequence is repeated as desired to build up the thickness of the resulting IMD layer.

Finally, Lou, in U.S. Pat. No. 5,759,906, discloses a method for forming an inter-level metal dielectric (IMD) layer suitable for multi-level interconnections. The method employs plasma enhanced chemical vapor deposition (PECVD) to form a silicon dioxide layer followed by a mutiple layer of at least four spin-on-glass (SOG) or spin-on-polymer (SOP) dielectric layers, each layer baked to minimize via poisoning problems. The multiple stack of dielectric layers is covered with a capping layer of undoped or doped silicon containing glass layers formed by plasma enhanced chemical vapor deposition (PECVD), providing a layer for chemical mechanical polish planarization without disturbing the SOG or SOP layers.

Desirable in the art of microelectronics fabrications are additional methods for forming inter-level metal dielectric (IMD) layers upon substrates employed within microelectronics fabrications. More particularly desirable in the art of integrated circuit microelectronics fabrications are additional methods for forming low dielectric constant dielectric layers upon underlying dielectric layers upon substrates employed within integrated circuit microelectronics fabrications to form inter-level metal dielectric (IMD) layers wherein formation of via contact holes is accompanied by attenuated via poisoning.

It is towards these goals that the present invention is generally and more specifically directed.

SUMMARY OF THE INVENTION

A first object of the present invention is to provide a method for forming upon a substrate employed within a microelectronics fabrication an inter-level metal dielectric (IMD) layer.

A second object of the present invention is to provide a method in accord with the first object of the present invention, where the inter-level metal dielectric (IMD) layer is formed employing low dielectric constant dielectric material deposited on a silicon oxide underlayer formed upon the substrate.

A third object of the present invention is to provide a method in accord with the first object of the present invention or the second object of *the present invention, where there may be formed via contact holes through the inter-level metal dielectric (IMD) layer with attenuated via poisoning.

A fourth object of the present invention is to provide a method in accord with the first object of the present invention, the second object of the present invention and/or the third object of the present invention, where the method is readily commercially implemented.

In accord with the objects of the present invention, there is provided by the present invention a method for forming upon a silicon containing glass dielectric layer upon a substrate employed within a microelectronics fabrication a dielectric layer formed by deposition of a low dielectric constant dielectric layer upon the silicon containing glass dielectric layer, where there may be formed via contact holes etched through the layer with attenuation of via poisoning. To practice the method of the present invention, there is first provided a substrate employed within a microelectronics fabrication. There is then formed over the substrate a patterned microelectronics layer. There is then formed over the patterned microelectronics layer a blanket silicon containing dielectric layer employing high density plasma chemical vapor deposition (HDP-CVD). There is then formed upon the silicon containing dielectric layer a low dielectric constant dielectric layer formed employing a low dielectric constant spin-on-glass (SOG) dielectric material. There is then formed a silicon oxide dielectric layer upon the SOG dielectric layer to form a composite inter-level metal dielectric (IMD) layer. There is then formed within the composite dielectric layer a series of etched via contact holes with attenuated via poisoning.

The present invention may be employed where an inter-level metal dielectric (IMD) layer is formed upon a substrate employed within a microelectronics fabrication. The method of the present invention does not discriminate with respect to the nature of the microelectronics fabrication within which there may be formed a low dielectric constant dielectric layer upon an underlying dielectric layer and other microelectronics layers. Thus the present invention may be employed with benefit where the microelectronics fabrications are integrated circuit microelectronics fabrications, charge coupled device microelectronics fabrications, solar cell microelectronics fabrications, ceramic substrate microelectronics fabrications and flat panel display microelectronics fabrications.

The present invention employs methods and materials as are known in the art of microelectronics fabrication, but in a novel order and sequence. Thus the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

FIRST PREFERRED EMBODIMENT

Figure 1:
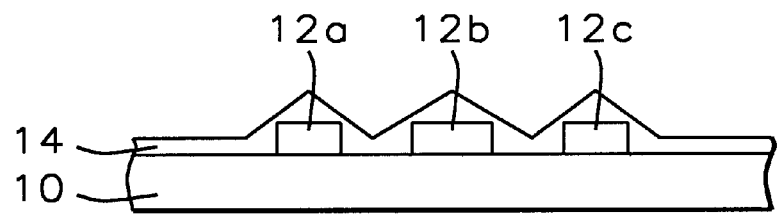
FIG. 1, FIG. 2 and FIG. 3 are directed towards a general embodiment of the present invention which constitutes a first preferred embodiment of the present invention. Shown in FIG. 1 to FIG. 3 is a series of schematic cross-sectional diagrams illustrating the results of forming upon a dielectric layer upon a substrate employed within a microelectronics fabrication an inter-level metal dielectric (IMD) layer, employing a silicon oxide dielectric layer formed upon a low dielectric constant dielectric material deposited upon the dielectric layer, wherein there may be formed via contact holes etched through the IMD layer while attenuating via poisoning.
Figure 2:
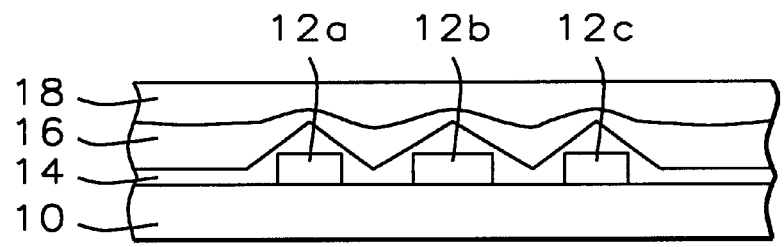
Figure 3:
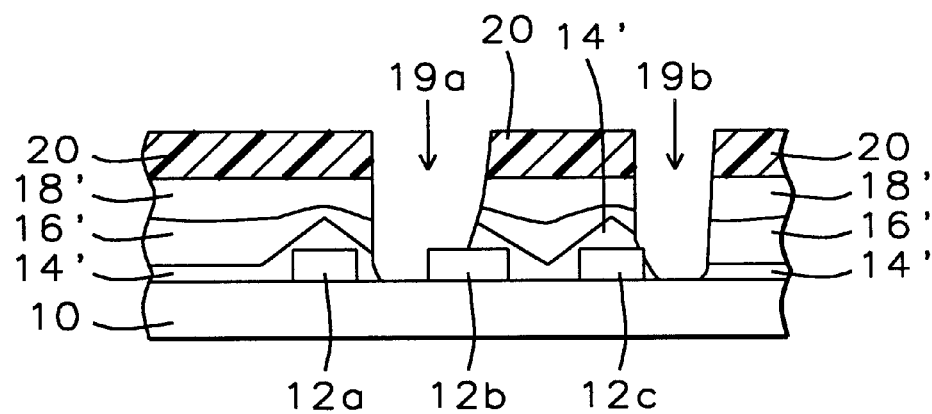

Referring now to FIG. 1 to FIG. 3, there is shown a series of schematic cross-sectional diagrams illustrating the results of forming upon a substrate employed within a microelectronics fabrication in accord with a general embodiment of the present invention which constitutes a first preferred embodiment of the present invention a composite inter-level metal dielectric (IMD) layer wherein there may be etched via contact holes with attenuated via poisoning. FIG. 1 is a schematic cross-sectional diagram of the microelectronics fabrication at an early stage in its fabrication.

Shown in FIG. 1 is a substrate 10 upon which is formed a patterned microelectronics layer 12a, 12b and 12c. Formed over and upon the substrate 10 and patterned microelectronics layer 12a, 12b and 12c is a blanket silicon containing glass dielectric layer 14.

With respect to the substrate 10 shown in FIG. 1, the substrate 10 may be the substrate 10 itself employed within a microelectronics fabrication, or alternatively the substrate 10 may incorporate any of several microelectronics layers formed upon the substrate. The substrate 10 may be formed from substrate material selected from the group comprising microelectronics conductor substrate material, microelectronics semiconductor substrate material and microelectronics insulator substrate material. The substrate 10 may be employed within a microelectronics fabrication chosen from the group including but not limited to integrated circuits microelectronics fabrications, charge coupled device microelectronics fabrications, solar cell microelectronics fabrications, ceramic substrate microelectronics fabrications and flat panel display microelectronics fabrications.

With respect to the patterned microelectronics layer 12a, 12b and 12c shown in FIG. 1, the pattered microelectronics layer 12a, 12b and 12c may be formed from materials selected from the group including but not limited to microelectronics conductor materials, microelectronics semiconductor materials and microelectronics dielectric materials deposited by methods including but not limited to thermal vacuum evaporation methods, electron beam evaporation methods, physical vapor deposition (sputtering) methods and chemical vapor deposition (CVD) methods. Patterning of microelectronics layers formed in this manner is accomplished employing photolithographic methods and materials as are known in the art of microelectronics fabrication.

With respect to the blanket silicon containing glass dielectric layer 14 shown in FIG. 1, the blanket silicon containing dielectric glass layer 14 is formed employing high density plasma chemical vapor deposition (HDP-CVD) method preferably employing: (1) gas flow rates of oxygen of from about 90 to about 120 standard cubic centimeters per minute (sccm), tetrafluoromethane (SiF4), silane (SiH$_4$) of about 3 standard cubic centimeters per minute (sccm) top and about 40 standard cubic centimeters per minute (sccm) side, argon of about 5 standard cubic centimeters per minute (sccm) top and 40 standard cubic centimeters per minute (sccm) side, and helium of about 5 standard cubic centimeters per minute(sccm); (2) reactor pressure of from about 3 to about 10 torr; (3) a substrate temperature of about 400 degrees centigrade; (4) a power of from about 800 watts (top), 3500 watts (side) and 3000 watts (bias). Preferably the silicon containing glass dielectric layer 14 is formed to a thickness of about 500 to about 1000 angstroms. The blanket silicon containing glass dielectric layer 14 may be formed as an undoped silicon containing glass (USG) by excluding the tetrafluoromethane (SiF$_4$) gas from the reactor. Alternatively, the silicon containing glass layer 14 may be formed with a dopant such as fluorine atoms from SiF$_4$ to constitute a fluorine-doped silicon containing glass (FSG).

Referring now more particularly to FIG. 2, there is shown a schematic cross-sectional diagram illustrating the results of further processing of the microelectronics fabrication whose schematic cross-sectional diagram is shown in FIG. 1. Shown in FIG. 2 is a microelectronics fabrication otherwise equivalent to the microelectronics fabrication shown in FIG. 1, but where there has been formed over the blanket silicon containing dielectric layer 14 a low dielectric constant dielectric layer 16. Formed over the blanket silicon containing dielectric glass layer 16 is a silicon oxide dielectric layer 18.

With respect to the low dielectric constant dielectric layer 16 shown in FIG. 2, the low dielectric constant dielectric layer 16 is formed employing low dielectric constant dielectric materials including but not limited to low dielectric constant organic polymer spin-on-polymer (SOP) dielectric materials, amorphous carbon chemical vapor deposited (CVD) dielectric materials and silsesquioxane (SQ) low dielectric constant spin-on-glass (SOG) dielectric materials. Preferably, the low dielectric constant dielectric layer 16 is formed employing hydrogen silsesquioxane (HSG) low dielectric constant spin-on-glass (SOG) dielectric material supplied by Dow Corning Co., 2200 West Salzburg Road, Auburn, Mich. 48611. Preferably, the low dielectric constant dielectric layer 16 is formed to a thickness of about 4000 angstroms.

With respect to the silicon oxide dielectric layer 18 shown in FIG. 2, the silicon oxide layer is formed employing tetra-ethyl-ortho-silicate (TEOS) gas and plasma enhanced chemical vapor deposition (PECVD). Preferably the silicon oxide dielectric layer is formed to a thickness of about 8000 angstroms.

Referring now more particularly to FIG. 3. there is shown a schematic cross-sectional diagram illustrating the results of further processing of the microelectronics fabrication whose schematic cross-sectional diagram is shown in FIG. 2. Shown in FIG. 3 is a microelectronics fabrication otherwise equivalent to the microelectronics fabrication shown in FIG. 2, but wherein there has been etched a series of via contact holes 19a and 19b through the silicon oxide dielectric layer 18', the low dielectric constant dielectric layer 16' and the silicon containing dielectric layer 14' to an underlying patterned conductor layer 12b and 12c employing the patterned photoresist etch mask layer 20.

With respect to the via contact holes 19a and 19b shown in FIG. 3. the series of via contact holes are etched through the patterned photoresist etch mask layer 20 employing methods and materials as are known in the art of microelectronics Fabrication. Preferably the etching process is a dry plasma process.

With respect to the patterned photoresist etch mask layer 20 shown in FIG. 3, the patterned photoresist etch mask layer 20 is formed employing materials and methods as are well known in the art of microelectronics fabrication.

The silicon containing dielectric glass layer 14' has been formed over the patterned microelectronics conductor layer 12a, 12b and 12c with a non-conformal surface profile which provides a more suitable distribution of dielectric material in the vicinity of the etched via contact holes 19a and 19b. The sidewalls of the silicon containing dielectric layer tend to be thinner than the bottom portions, and hence more of the final dielectric material within the gap between patterned conductor lines is composed of the low dielectric constant dielectric material of the spin-on-glass (SOG) dielectric material. This tends to reduce capacitance between patterned conductor lines.

The advantages of the silicon containing glass dielectric layer formed by HDP-CVD method as an underlayer for subsequent etching of via contact holes also are apparent in the relative ease of etching of the silicon containing glass dielectric material to permit access to the underlying conductor line at the bottom of the etched via contact hole. This tends to increase contact area within the via contact hole at the patterned conductor line. As cited above, the thinner sidewalls of dielectric material provided by the HDP-CVD method are more easily etched away in forming via contact holes.

The silicon containing glass dielectric layer formed by HDP-CVD method is of higher quality with respect to density and freedom from voids and defects compared to PECVD silicon oxide dielectric layers. Hence the method of the present invention provides a reduction in the amount of residual contamination within the via contact hole as it is etched through the IMD layer, resulting in a reduction of via poisoning.

SECOND PREFERRED EMBODIMENT

Figure 4:
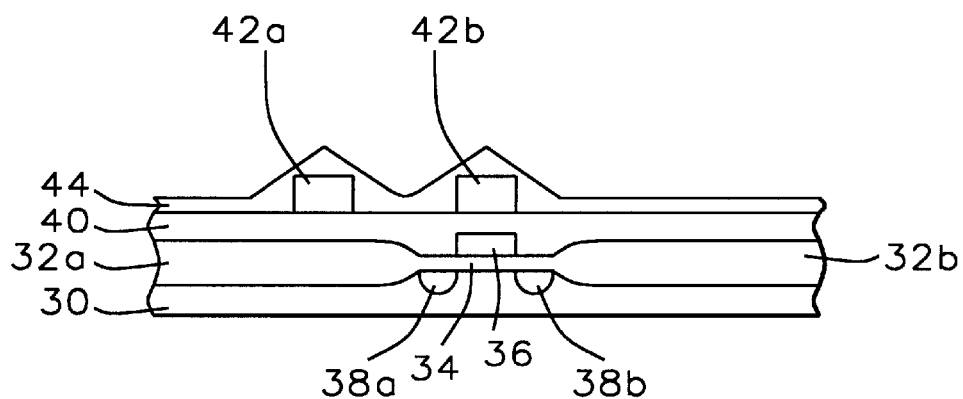
FIG. 4, FIG. 5 and FIG. 6 are directed towards a more specific embodiment of the present invention which constitutes a second preferred embodiment of the present invention. Shown in FIG. 4 to FIG. 6 is a series of schematic cross-sectional diagrams illustrating the results of forming upon a silicon containing glass dielectric layer formed upon a semiconductor substrate employed within an integrated circuit microelectronics fabrication a low dielectric constant dielectric layer upon which is formed a silicon oxide dielectric layer to form a composite inter-level metal dielectric (IMD) layer, within which there may be formed via contact holes etched through the composite IMD layer with attenuated via poisoning.
Figure 5:
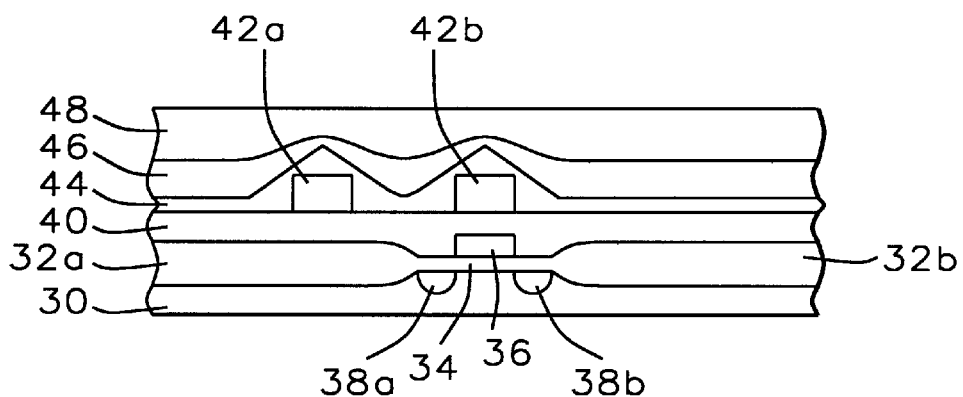
Figure 6:
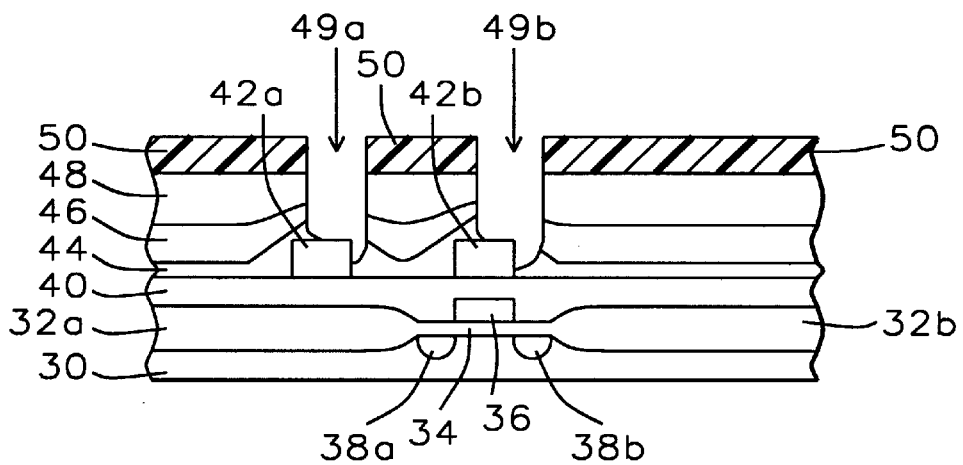

Referring now more particularly to FIG. 4 to FIG. 6, there is shown a series of schematic cross-sectional diagrams illustrating the results of forming, in accord with a more specific embodiment of the present invention which constitutes a second preferred embodiment of the present invention, upon a semiconductor substrate employed within an integrated circuit microelectronics fabrication a composite dielectric layer, formed employing a silicon oxide dielectric layer formed over a low dielectric constant spin-on-glass (SOG) dielectric material deposited upon a silicon containing dielectric layer formed upon the semiconductor substrate, wherein there may be formed etched via contact holes with attenuated via poisoning. FIG. 4 is a schematic cross-sectional diagram of the integrated circuit microelectronics fabrication at an early stage in its fabrication.

Shown in FIG. 4 is a semiconductor substrate 30 wherein there has been formed structures comprising typical field effect transistor (FET) devices as are found conventionally formed in the art of integrated circuit microelectronics fabrications. Isolation areas 32a and 32b are formed adjacent to the active device area wherein are formed a gate oxide insulation layer 34, a gate electrode 36 and source/drain regions 38a and 38b. Formed over the substrate and integrated circuit structures is a pre-metal dielectric (PMD) layer 40 upon which is formed a patterned microelectronics conductor layer 42a and 42b. Formed over the pre-metal dielectric (PMD) layer 40 and patterned microelectronics conductor layer 42a and 42b is a silicon containing dielectric layer 44 employing high density plasma chemical vapor deposition (HDP-CVD).

With respect to the semiconductor substrate 30 shown in FIG. 4, the semiconductor substrate 30 is a silicon semiconductor substrate. Although silicon semiconductor substrates are known in the art of microelectronics fabrication with various degrees of crystallinity, crystalline orientation and doping levels of either polarity, preferably the silicon semiconductor substrate is a (100) crystal orientation N- or P-type silicon substrate.

With respect to the various microelectronics structures comprising the field effect transistor (FET) device formed upon and within the silicon semiconductor substrate 30, the FET device structures are fabricated employing methods and materials which are well known in the art of FET integrated circuit microelectronics fabrication.

With respect to the pre-metal dielectric (PMD) layer 40 shown in FIG. 4, the pre-metal dielectric (PMD) layer 40 is formed from dielectric material including but not limited to silicon containing dielectric material and carbon containing dielectric material employing methods as are known in the art of microelectronics fabrication including but not limited to chemical vapor deposition methods, physical vapor deposition methods and spin-on methods. Preferably the pre-metal dielectric (PMD) dielectric layer employs silicon containing dielectric material formed with a planar surface.

With respect to the patterned microelectronics conductor layer 42a and 42b shown in FIG. 4, the patterned microelectronics conductor layer 42a and 42b may be formed from microelectronics conductor materials including but not limited to microelectronics metals, alloys, conductive compounds and semiconductors employing methods known in the art of microelectronics fabrication including but not limited to thermal vacuum evaporation, electron beam evaporation, chemical vapor deposition (CVD) and physical vapor deposition (PVD) sputtering. Patterned layers are formed from the microelectronics layers employing photolithographic methods and materials as are known in the art of microelectronics fabrication With respect to the blanket silicon containing glass dielectric layer 44 shown in FIG. 4, the silicon containing glass dielectric layer 44 is formed analogous or equivalent to the silicon containing glass dielectric layer 14 shown in FIG. 2 of the first preferred embodiment of the present invention. Preferably the silicon containing glass dielectric layer has been doped with fluorine atoms by addition of a fluorine containing gas to the reactant gases to form a fluorine-doped silicon containing glass (FSG) dielectric layer with a lower dielectric constant than undoped silicon containing glass (USG) dielectric layer.

Referring now more particularly to FIG. 5, there is shown a schematic cross-sectional diagram illustrating the results of further processing of the integrated circuit microelectronics fabrication whose schematic cross-sectional diagram is shown in FIG. 4 in accord with the preferred second embodiment of the present invention. Shown in FIG. 5 is an integrated circuit microelectronics fabrication otherwise equivalent to the integrated circuit microelectronics fabrication shown in FIG. 4, but where there has been formed over the substrate and upon the blanket silicon containing glass dielectric layer 44 employing a hydrogen silsesquiox- ane (HSQ) low dielectric constant spin-on-glass (SOG) dielectric material a low dielectric constant dielectric layer 46. Formed over the low dielectric constant dielectric layer 46 is a silicon oxide dielectric layer 48.

With respect to the low dielectric constant dielectric layer 46 shown in FIG. 5, the low dielectric constant dielectric layer 46 is formed analogous or equivalent to the low dielectric constant dielectric layer 16 shown in FIG. 3 of the first preferred embodiment of the present invention.

With respect to the silicon oxide dielectric layer 48 shown in FIG. 5, the silicon oxide dielectric layer 48 is analogous or equivalent to the silicon oxide dielectric layer 18 shown in FIG. 2 of the first preferred embodiment of the present invention.

Referring now more particularly to FIG. 6, there is shown a schematic cross-sectional diagram illustrating the results of further processing of the integrated circuit microelectronics fabrication whose schematic cross-sectional diagram is shown in FIG. 5 in accord with the second preferred embodiment of the present invention. Shown in FIG. 6 is an integrated circuit microelectronics fabrication otherwise equivalent to FIG. 5, but where there has been etched through the silicon oxide dielectric layer 48', the low dielectric constant dielectric layer 46' and the blanket silicon containing glass dielectric layer 44' employing a patterned photoresist etch mask layer 50 a series of via contact holes 49a and 49b to contact the patterned conductor lines 42a and 42b.

With respect to the series of etched via contact holes 49a and 49b shown in FIG. 6, the series of etched via contact holes 49a and 49b are formed analogous or equivalent to the series of etched via contact holes 19a and 19b shown in FIG. 3 of the first preferred embodiment of the present invention.

With respect to the patterned photoresist etch mask layer 50 shown in FIG. 6, the patterned photoresist etch mask layer 50 is analogous or equivalent to the patterned photoresist etch mask layer 20 shown in FIG. 1 of the first preferred embodiment of the present invention.

The formation of etched via contact holes located over the underlying contact regions exposes the underlying materials and structure after the via contact hole is opened. It is desirable that there be no retention of underlayer, foreign material or moisture within or by the surfaces of the opened via contact hole, and the method of the present invention is beneficial in that regard. The underlying silicon containing dielectric layer is formed employing high density plasma chemical vapor deposition (HDP-CVD) which is known to provide a high quality dielectric material from the standard of density, purity and freedom from porosity and structural defects. However, the fluorine doped silicon containing glass (FSG) dielectric layer has a high etch rate and thus is easily removed completely from the etched via. Nevertheless the higher density and reduced porosity of the silicon containing glass dielectric material is less likely to retain moisture or other contaminants to react with the low dielectric constant dielectric material such as HSQ, and so is likely to attenuate the poisoning of the via hole.

The present invention provides coverage by the silicon containing dielectric layer over the top of the conductor layer which is thinner because of the HDP-CVD method employed. This results in easier removal of undoped silicon containing glass (USG) or fluorine doped silicon containing glass (FSG), whichever is employed.

As is understood by a person familiar with the art, the particular embodiments of the present invention are illustrative of the present invention rather than limiting of the present invention. Modifications may be made to the methods, materials, structures and dimensions of the first preferred embodiments of the present invention to effect other embodiments of the present invention without departing from the spirit and scope of the present invention, as described in the appended claims.

What is claimed is:

1. A method for forming upon a substrate employed within a microelectronics fabrication a dielectric layer comprising:

providing a substrate employed within a microelectronics fabrication;

forming upon the substrate a patterned microelectronics layer;

forming upon the patterned microelectronics layer a blanket fluorine-doped silicon containing glass (FSG) low dielectric constant dielectric layer employing a high density plasma chemical vapor deposition (HDP-CVD) method;

forming over the blanket fluorine-doped silicon glass (FSG) low dielectric constant dielectric layer a second blanket low dielectric constant dielectric layer; and forming over the second blanket low dielectric constant dielectric layer a silicon oxide dielectric layer to form a composite inter-level metal dielectric (IMD) layer.

2. The method of claim 1 wherein the substrate is employed within a microelectronics fabrication selected from the group consisting of:

integrated circuit microelectronics fabrications;

charge coupled device microelectronics fabrications;

solar cell microelectronics fabrications;

ceramic substrate microelectronics fabrications; and flat panel display microelectronics fabrications.

3. The method of claim 1 wherein the patterned microelectronics layer is a microelectronics conductor layer formed from materials selected from the group consisting of:

microelectronics metallic materials;

microelectronics alloys;

microelectronics conductive compounds; and microelectronics semiconductor materials.

4. The method of claim 1 wherein the low dielectric constant dielectric layer is formed employing a hydrogen silsesquioxanie (HSQ) spin-on-glass (SOG) dielectric material.

5. The method of claim 1 wherein the silicon oxide dielectric layer is formed employing plasma enhanced chemical vapor deposition (PECVD) from tetra-ethyl-orthosilicate (TEOS) gas.

6. The method of claim 1 wherein via contact holes are etched through the composite IMD layer employing a patterned photoresist etch mask layer and dry plasma anisotropic etching.

7. The method of claim 6 where there is attenuated via poisoning of the etched via holes.

8. A method for forming upon a semiconductor substrate employed within an integrated circuit microelectronics fabrication an inter-level metal dielectric (IMD) layer between microelectronics conductor layers comprising:

providing a semiconductor substrate having formed within and upon it typical integrated circuit microelectronics structures;

forming over the semiconductor substrate a patterned microelectronics conductor layer;

forming over the patterned microelectronics conductor layer a blanket fluorine-doped silicon containing glass (FSG) low dielectric constant dielectric layer employing a high density plasma chemical vapor deposition (HDP-CVD) method;

forming over the beet fluorine-doped silicon containing glass (FSG) low dielectric constant dielectric a second blanket low dielectric constant dielectric layer;

forming over the second blanket low dielectric constant dielectric layer a silicon oxide dielectric cap layer to provide an inter-level metal dielectric (IMD) layer; and etching via contact holes through the IMD layer.

9. The method of claim 8 wherein the semiconductor substrate is a silicon semiconductor substrate.

10. The method of claim 8 wherein the typical integrated circuit microelectronics structures comprise field effect transistor (FET) structures.

11. The method of claim 8 wherein a blanket silicon oxide dielectric layer with a planar surface is formed over the integrated circuit microelectronics structures formed within the semiconductor substrate.

12. The method of claim 8 wherein the patterned microelectronics layer is formed employing microelectronics conductor materials.

13. The method of claim 8 wherein the low dielectric constant dielectric layer is formed employing hydrogen silsesquioxane (HSQ) low dielectric constant spin-on-glass (SOG) dielectric material.

14. The method of claim 8 wherein the silicon oxide dielectric cap layer is formed employing tetra-ethyl-orthosilicate (TAOS) gas and a plasma enhanced chemical vapor deposition (PECVD) method.

15. The method of claim 8 wherein the silicon containing glass dielectric layer, the low dielectric constant dielectric layer and the silicon oxide dielectric layer taken together constitute an inter-level metal dielectric (IMD) layer with reduced capacitance between conductor layers.

16. The method of claim 8 wherein the via contact holes are etched employing a patterned photoresist etch mask layer and a dry plasma anisotropic etch method.

17. The method of claim 8 wherein there is attenuated via poisoning of the etched via holes.

* * * * *